(12) United States Patent
Lee et al.

(10) Patent No.: US 7,183,134 B2
(45) Date of Patent: Feb. 27, 2007

(54) ULTRATHIN LEADFRAME BGA CIRCUIT PACKAGE

(75) Inventors: Teck Kheng Lee, Singapore (SG); Tan Yong Kian, Singapore (SG); Setho Sing Fee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 25 days.

(21) Appl. No.: 10/931,363

(22) Filed: Aug. 31, 2004

(65) Prior Publication Data

US 2005/0026386 A1   Feb. 3, 2005

Related U.S. Application Data

(62) Division of application No. 10/233,159, filed on Aug. 29, 2002.

(30) Foreign Application Priority Data

Apr. 19, 2002   (SG)   ............................. 200202330-7

(51) Int. Cl.
  *H01L 21/44*   (2006.01)
(52) U.S. Cl. ................... 438/106; 257/666; 257/678
(58) Field of Classification Search ........ 257/666–669, 257/734–738, 678; 438/106–108
See application file for complete search history.

(56) References Cited

U.S. PATENT DOCUMENTS

| | | | |
|---|---|---|---|
| 5,363,279 A | 11/1994 | Cha | |
| 5,420,459 A * | 5/1995 | Kozono | ....................... 257/666 |
| 5,541,447 A | 7/1996 | Maejima et al. | |
| 5,917,241 A | 6/1999 | Nakayama et al. | |
| 6,078,099 A | 6/2000 | Liu et al. | |
| 6,201,294 B1 | 3/2001 | Lee | |
| 6,274,927 B1 | 8/2001 | Glenn | |
| 6,339,252 B1 | 1/2002 | Niones et al. | ............... 257/666 |
| 6,340,837 B1 | 1/2002 | Miyaki et al. | ............... 257/666 |
| 6,348,726 B1 | 2/2002 | Bayan et al. | ................ 257/666 |
| 6,388,311 B1 | 5/2002 | Nakashima et al. | ........ 257/676 |
| 6,400,004 B1 | 6/2002 | Fan et al. | |
| 6,427,976 B1 | 8/2002 | Huang et al. | |
| 6,437,429 B1 | 8/2002 | Su et al. | |
| 6,476,471 B1 | 11/2002 | Buck, Jr. | ..................... 257/678 |
| 6,498,393 B2 | 12/2002 | Fujimoto et al. | ........... 257/692 |
| 6,667,541 B1 | 12/2003 | Minamio et al. | |
| 6,724,071 B2 | 4/2004 | Combs | |
| 6,762,067 B1 | 7/2004 | Quinones et al. | |
| 6,798,046 B1 * | 9/2004 | Miks | ........................... 257/666 |

(Continued)

FOREIGN PATENT DOCUMENTS

JP   2000-114426   4/2000

*Primary Examiner*—Nathan W. Ha
(74) *Attorney, Agent, or Firm*—Schwegman, Lundberg, Woessner & Kluth, P.A.

(57) ABSTRACT

A circuit package is formed using a leadframe. The leadframe is formed or etched to align a plurality of bond pad structures above a reference plane while supporting leadframe fingers are positioned below the reference plane. Jumper wires are wirebonded between terminals on the die and the bond pads to form a package subassembly. The subassembly is encapsulated and then background to remove the leadframe fingers and surrounding frame. The bond pads which remain embedded in the encapsulation material are exposed on the lower surface of the package for connection to further conductors.

26 Claims, 3 Drawing Sheets

U.S. PATENT DOCUMENTS

| | | |
|---|---|---|
| 2002/0053721 A1 | 5/2002 | Kubara et al. |
| 2002/0130400 A1 | 9/2002 | Jeong et al. ................ 257/670 |
| 2002/0135049 A1 | 9/2002 | Liu ............................ 257/666 |
| 2002/0140061 A1 | 10/2002 | Lee ............................ 257/666 |
| 2002/0145186 A1 | 10/2002 | Tzu et al. |
| 2002/0149090 A1 | 10/2002 | Ikenaga et al. ............. 257/666 |
| 2003/0020146 A1 | 1/2003 | Yee et al. ................... 257/666 |
| 2003/0179549 A1* | 9/2003 | Zhong et al. ............... 361/707 |
| 2005/0133905 A1* | 6/2005 | Zhao et al. ................. 257/706 |

* cited by examiner

ULTRATHIN LEADFRAME BGA CIRCUIT PACKAGE

This application is a Divisional of U.S. application Ser. No. 10/233,159, filed Aug. 29, 2002, which claims priority under 35 U.S.C. 119 from Singapore Application No. 200202330-7, filed Apr. 19, 2002, both of which are incorporated herein by reference.

BACKGROUND

Leadframes have been used to support terminals for connection to integrated circuit dies as a package is formed.

In some embodiments of the present invention a leadframe provides a die pad and surrounding bondpads. A die is mounted on the die pad and connections are made between the die and some of the bondpads. The support members for the bondpads and the remainder of the leadframe are positioned to lie below a reference plane defined relative to the lower surface of the die and the lower surface of the bondpads. The leadframe, die and bondpads are encapsulated in insulating material and the package is processed to remove all of the interstitial and leadframe material that lie below the reference plane. The lower surface of the resulting package has an array of bondpads adjacent the die pad.

DESCRIPTION OF EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural changes may be made without departing from the spirit and scope of the present invention.

For convenience, reference has been made in the specification and claims to various surfaces as "upper" or "lower". It is not intended that such descriptions be absolute, since repositioning of a described object to an orientation other than that shown in the attached drawings may change their classification, but not their orientation relative to each other. Thus such terms are used in a relative rather than an absolute sense.

The following detailed description is not to be taken in a limiting sense, and the scope of the present invention is defined by the appended claims.

Figure 1:
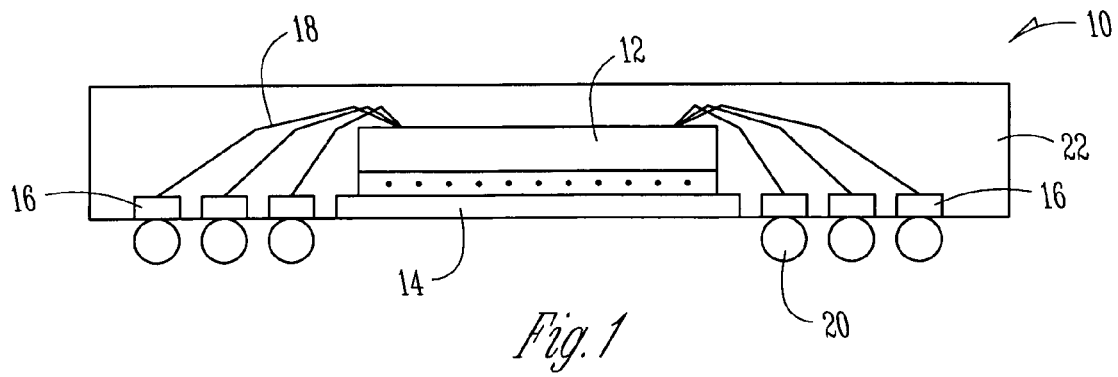
FIG. 1 is a sectional elevation view of an integrated circuit package formed according to an embodiment of the invention.

In FIG. 1, an integrated circuit package 10 carrying a semiconductor die 12 illustrates a package manufactured in accordance with an embodiment of the invention. Die 12 has its inactive, or lower, face attached to a die pad 14 by conventional die attachment or lead-on-chip (LOC) process technology for attaching a die to a die pad using adhesive or double backed tape, as known in the art. The active, or upper, surface of die 12 has on it a number of terminals or vias which connect to various points in electronic circuits within die 12.

A plurality of bond pads 16 are each connected by jumper wires or conductors 18 to the terminals or vias exposed on the upper surface of die 12. One end of a jumper wire or conductor 18 is wirebonded or otherwise conductively attached to a terminal or via on the upper surface of die 12. The other end of conductor 18 is connected to a corresponding bond pad 16. The die 12, die pad 14, jumper wires 18 and bond pads 16 together form a subassembly which may then be encapsulated in a suitable thermoplastic or thermoset material 22 to form an oversized electronic circuit package. After the lower surface of bond pads 16 is exposed as described below, solder balls 20 are applied to the lower surface of each bond pad. The solder balls 20 facilitate the connection of bond pads 16 of package 10 to circuit conductors on a motherboard or other printed circuit board providing electrical connections between die 12 and other circuits to form an electronic system.

Figure 2:
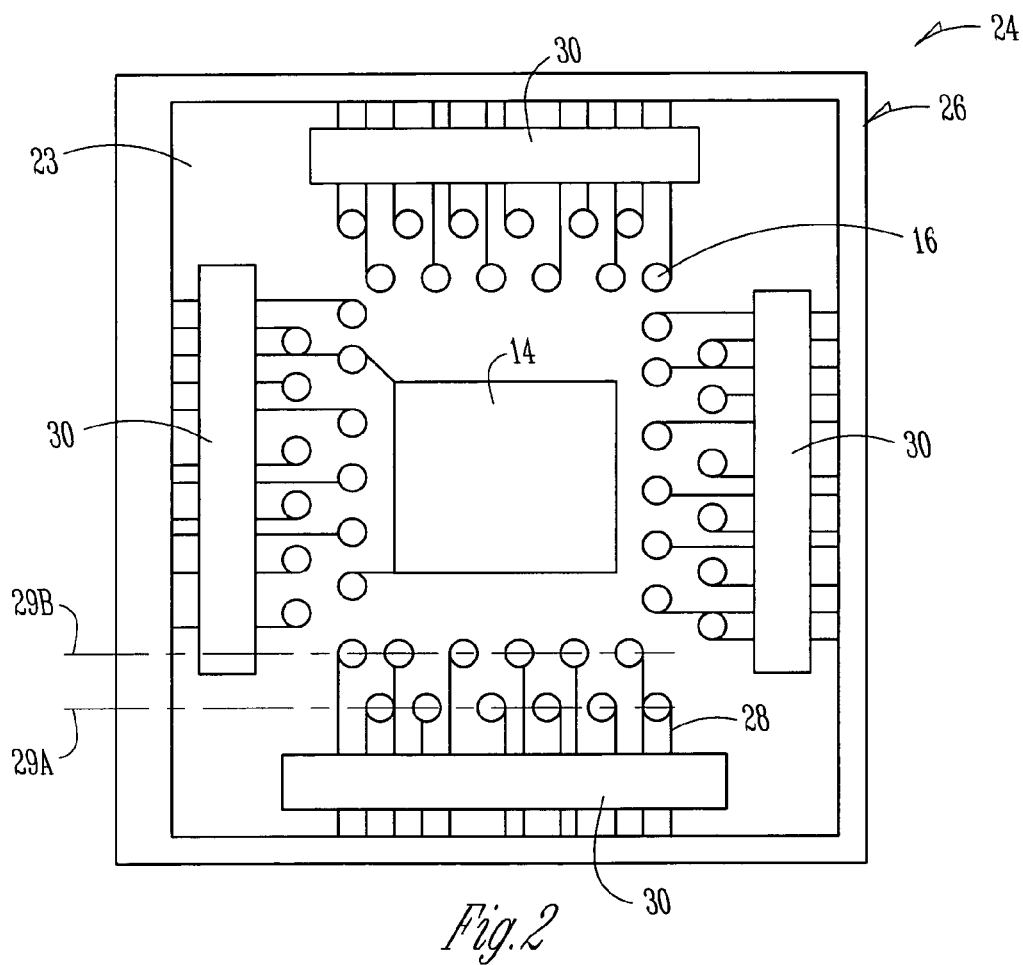
FIG. 2 is a view of an embodiment of a leadframe in accordance with the invention and which is constructed and arranged for assembly into a circuit package in accordance with an embodiment of the invention.

FIG. 2 is a top view of a leadframe structure used in an embodiment of the invention for arranging bondpads 16 surrounding die pad 14. In one embodiment of the invention the leadframe 24 may be etched or stamped from a single sheet of a suitable conductive material such as copper or a copper alloy. In another embodiment of the invention a further layer of material may be added to at least the die pad region 14 to facilitate its functioning as a heat spreader to conduct heat away from individual concentrations of heat on the lower surface of die 12.

Etching the sheet material to manufacture the leadframe 24 may permit the creation of more complex arrangements of bond pads 16 in the open portion 23 of the leadframe 24 adjacent die pad 14. Multiple leadframes 24 may be produced on a large sheet in the stamping or etching process and later singulated into separate leadframes 24 for use in individual packages 10 at various stages of the manufacturing process. Though the drawings in the present application illustrate the manufacture of a single integrated circuit package 10 from a single leadframe 24, it will be appreciated by one skilled in the art that the various embodiments of the manufacturing process described herein may also be practiced on multiple packages with the singulation into individual packages occurring at several suitable places in the process after the encapsulating step described below.

Frame portion 26 has a plurality of support fingers 28 extending inwardly from it and supporting bond pads 16 with their proximal portion. Both frame portion 26 and support fingers 28 comprise support members for bond pads 16 prior to their encapsulation in interstitial material 22. As shown in FIG. 2, according to one embodiment of the invention, bond pads 16 are arranged in multiple staggered courses or rows such as the two staggered separate courses or rows 29a or 29b surrounding die pad 14 to provide an array of staggered bond pads. It will be appreciated by those skilled in the art that a number of other staggered and aligned bond pad configuration geometries are possible and indeed, are facilitated by the flexibility of application of embodiments of the present invention.

Each of the support fingers 28 between the frame portion 26 and bond pad 16 has a width which may be substantially narrower than the width or length dimensions of generally rectilinearly shaped bond pads 16 or a diameter or chord of either oval, octagonal or curvilinearly shaped bond pads. When two or more staggered multiple courses 29 of bond pads 16 are arrayed adjacent a die pad 14, the width dimension of the supporting fingers 28, viewed in the plane of the leadframe 24, are substantially less that the surface dimensions of bond pad 16.

In preparing the leadframe 24 for carrying out the package forming methods according to an embodiment of the invention, adhesive strips 30 are applied to secure fingers 28 to a supporting substrate 32 during the assembly process. The use of adhesive strips 30 is optional and can be directly beneath bond pad 16 or nearby to provide support during the assembly process. Securing fingers 28 to substrate 32 using tape strips 30 strengthens them during the wire bonding operation used for connecting jumper wires 18 between terminals on die 12 and bond pads 16.

Figure 3:
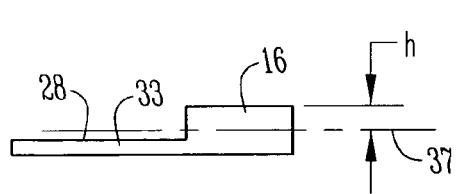
FIG. 3 is a detailed side elevation cross-section view showing an etching operation which may be a part of the process for preparing the leadframe for assembly of a package in accordance with an embodiment of the invention.

In FIG. 3 there is shown a detail elevation view of a bond pad 16 which is supported at the end of a finger 28 extending inwardly from leadframe frame portion 26. In one embodiment an etching process is carried out to selectively reduce the thickness of a portion of the leadframe finger or support member 28. In FIG. 3, the portion of the finger or support member 28 distal of the bond pad16 is etched away to lower the top surface 33 of finger 28 so that the entirety of that portion of the length of finger 28 is lowered below a reference plane 37 which passes through bond pad 16 at a distance below the upper surface of bond pad 16 which is suitable for the finished height h of bond pad 16.

Once the subassembly is completed and encapsulated as discussed below, the portions of leadframe 24 which are located below reference plane 37 are removed by grinding, or some other material removing operation, to leave the upper portion of bond pads 16 exposed on the lower surface of package 10. Because the grinding removes of the material below the reference plane 37, the portions of fingers 28 distal of the bond pads is removed, leaving the remaining portion of the bond pad supported by the interstitial material 22 with the lower face of the bond pad 16 exposed for receiving solder balls 20 or solder for connection the terminals of the package 1—to conductors on a some printed circuit board to allow the package to become part of an electronic system.

Figure 4:
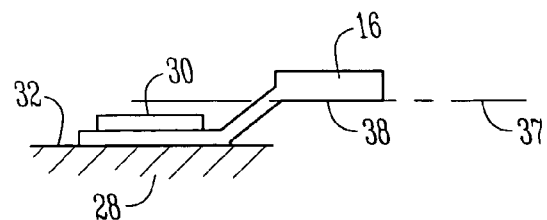
FIG. 4 is a detailed side elevation cross-section views showing a mechanical forming operation which may be a part of the process for preparing the leadframe for assembly of a package in accordance with an embodiment of the invention.

In FIG. 4 there is shown a detail elevation view of a bond pad 16 which is at the end of a support finger 28 extending inwardly from the perimeter portion 26 of the leadframe. The fingers 28 are mechanically formed so as to separate the reference plane 37 defined by the lower surface 38 of bond pads 16 away from the surface of substrate 32 before fingers 28 are secured to substrate 32 with tape 30.

Figure 5:
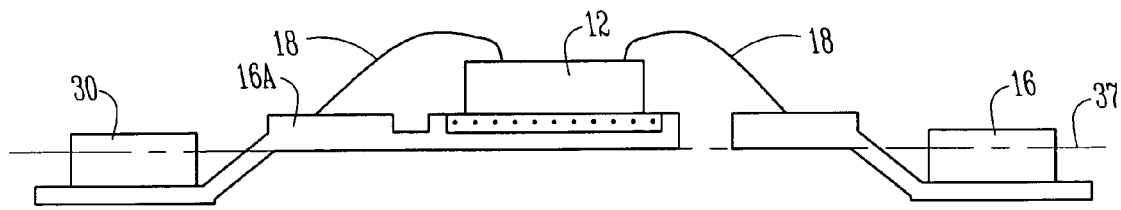
FIG. 5 is a side elevation cross-section view showing a an embodiment of a subassembly of a leadframe and die for use in forming an integrated circuit package in accordance with an embodiment of the invention.

FIG. 5 shows an elevation view of the package with die 12 attached to die pad 14 and elevated above the taped portions of fingers 28 which are secured to substrate 32. In FIG. 5, bond pad 16a is shown extending from and therefore, electrically connected to die pad 14 to provide a connection to exterior circuits for the ground plane provided by die pad 14. Other bond pads 16 are generally not connected to die pad 14 by fingers 28 of leadframe24.

Figure 6:
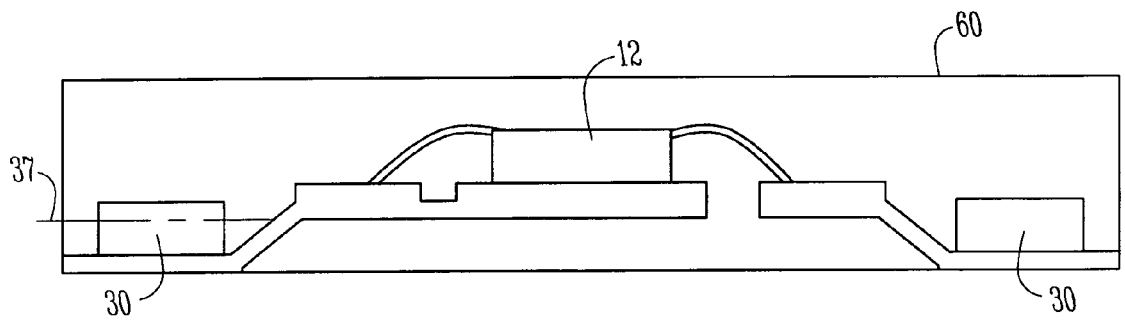
FIG. 6 is a side elevation cross sectional view of an oversized molded integrated circuit package prior to singulation and backgrinding.

FIG. 6 also shows the jumper wires or conductors 18 which have their ends wirebonded respectively to bond pads 16 and to terminals on the active surface of die 12. In one embodiment, the wirebonding process is preferably carried out while portions of the length of fingers 28 remain taped to substrate 32 to increase the resistance to bending and damage of the thin leadframe during the wirebonding process.

FIG. 6 illustrates package 10 following molding of the subassembly into an oversized molded structure by encapsulating the subassembly in a suitable interstitial material 22 which may be a thermosetting plastic or other readily moldable material as is commonly used in the art. The oversized molded structure contains the taped portions of fingers 28. Once the intyerstitial material 22 has cured ior otherwise solidified, the package may then be singulated to reduce it to an oversized single die package that is then ground and further singulated to the final sized package 10 shown in cross section in FIG. 7. The grinding may be performed by backgrinding or surface grinding machines as are presently used for the surface grinding of semiconductor wafers.

Figure 7:
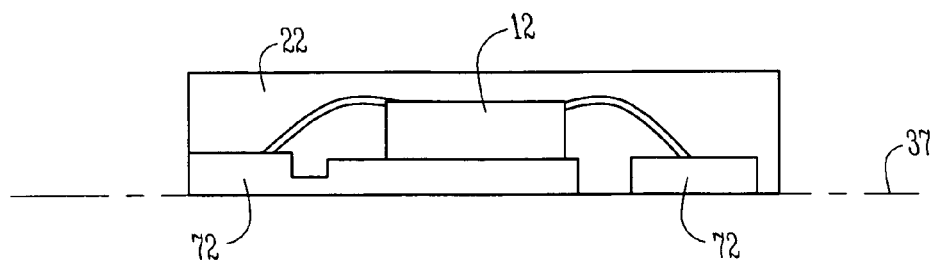
FIG. 7 is a cross-section elevation view of the oversized package of FIG. 6 after removal of interstitial material and the distal support members.
Figure 8:
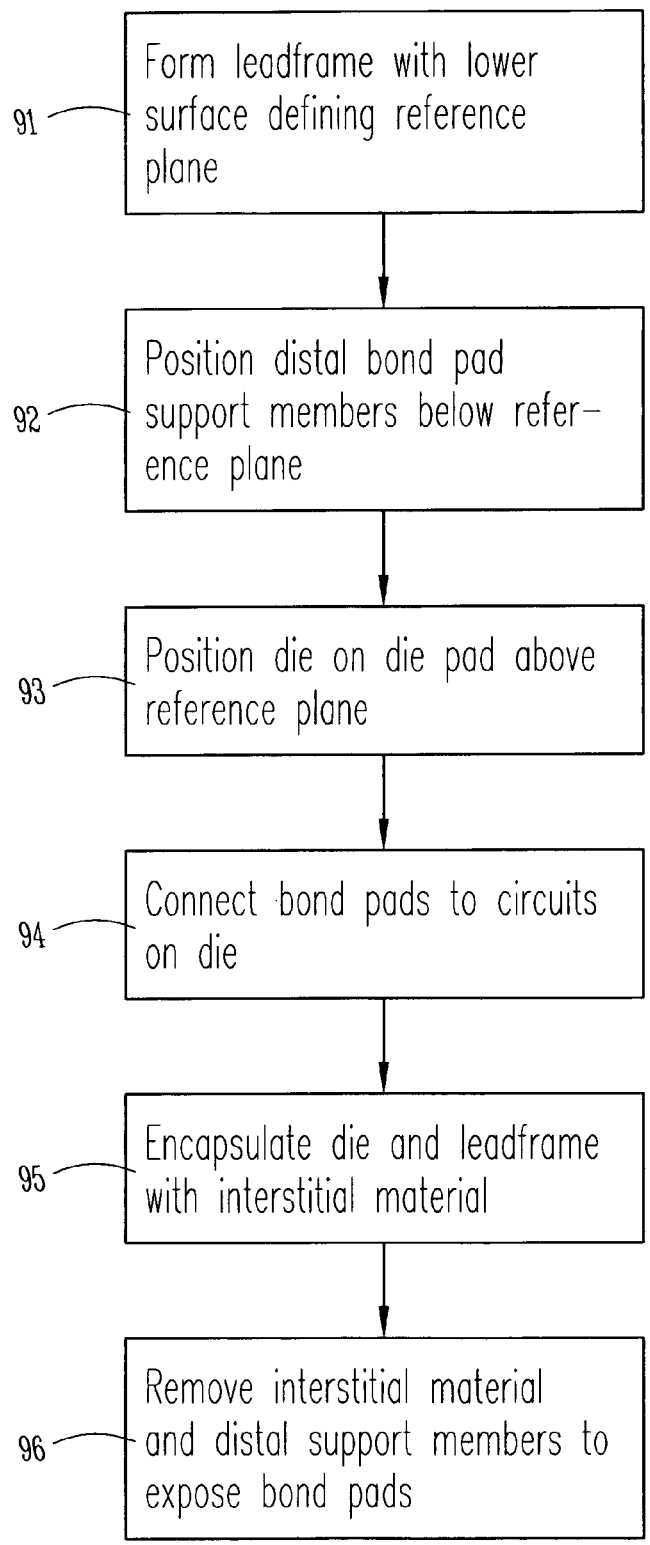
FIG. 8 is a flow chart of integrated circuit package forming operations in accordance with an embodiment of the present invention.

In the package of FIG. 7, the lower surfaces 72 of bond pads 16 are exposed as a part of the backgrinding process and the portions of fingers 28 distal of the bond pads 16 were removed along with tape 30 and the remainder of the surrounding support frame portion 26 of leadframe 24. Addition of solder balls 20 to the freshly exposed, recently ground, lower faces of bond pads 16 completes the manufacture of the package 10 to the configuration shown in FIG. 1.

FIG. 9 is a flow chart of the manufacturing operations that may be followed in manufacturing a die package according to an embodiment of the present invention. In the portion of the process of block 91 the leadframe is formed with a lower surface thereof defining a reference plane. The leadframe support members are positioned below the reference plane in a further operation 92. In a further operation 93 the die is mounted on the die pad with the body of the die positioned above the die pad. In a further operation 94 some of the bond pads are connected to terminals on the die. The die and leadframe are then encapsulated with interstitial material in operation 95. In the final block 96 the distal support members and interstitial material lying below the reference plane are removed by grinding, etching or some other material removal process.

It is to be understood that the above description is intended to be illustrative, and not restrictive. Many other embodiments will be apparent to those of skill in the art after reviewing the above description. The scope of the invention should, therefore, be determined with reference to the appended claims, along with the full scope of equivalents to which such claims are entitled.

What is claimed is:

1. A method for forming an integrated circuit package:
    forming a leadframe with a plurality of bond pads supported by support members, the bond pads and support members formed from a single sheet of conductive material having a lower surface lying in a reference plane;

positioning the portion of the support members distal of the bond pads below the reference plane;

positioning a die adjacent some of the plurality of bond pads with the lower surface of the die lying above the reference plane;

connecting at least one terminal on the die to at least one of the plurality of bond pads;

encapsulating the die, bond pads and support members in an interstitial material; and removing the portion of the interstitial material and the portion of the support members distal to the bond pads to provide a lower surface for the package in which the lower faces of bond pads are exposed.

2. The method of claim 1 wherein placing the portion of the support members distal of the bond pads below the reference plane comprises forming the leadframe to force the portion of the support members distal of the bond pads below the reference plane.

3. The method of claim 2 wherein a portion of the length of the support members is taped to a support surface.

4. The method of claim 1 wherein placing the portion of the support members distal of the bond pads below the reference plane comprises selectively etching portions of the leadframe, including the upper surface of the portion of the support members distal of the bond pads, to place the upper surface of the portion of the support members distal of the bond pads below the reference plane.

5. The method of claim 1 wherein positioning a die also comprises bonding the die to a die pad whose lower surface lies above the reference plane.

6. The method of claim 1 wherein connecting at least one terminal on the die to at least one of the plurality of bond pads comprises wirebonding at least one jumper wire between the at least one terminal of the plurality of bond pads.

7. The method of claim 1 removing the interstitial material comprises mechanically grinding the interstitial material and the portion of the support members distal to the bond pads.

8. A method for forming an integrated circuit package, comprising:

forming a leadframe having a frame member surrounding a space for receiving a semiconductor integrated circuit die, the frame member having a plurality of fingers projecting inwardly from the frame member in to the space, at least some of the fingers having bond pads at their inwardly extending ends, the bond pads being disposed around the space for receiving the circuit die;

positioning a die in the space surrounded by the bond pads and connecting at least one of the bond pads to circuits on the die;

offsetting the top surface of the frame member and substantially the entire length of at least one of the fingers to lie below the lower of the die and the surface of the bond pad members;

encapsulating the assembly in interstitial material to form an oversized circuit package; and removing material from the lower surface of the oversized circuit package to define a package having a lower surface exposing the lower face of the bond pads while removing substantially the entire length of the fingers and the frame member.

9. The method of claim 8 wherein the leadframe also comprises a die pad and positioning the die comprises bonding the die to the die pad.

10. The method of claim 9 wherein bonding the die to the die pad comprises applying double backed adhesive tape to a surface of the die and the die pad.

11. The method of claim 8 wherein the bond pads are circular.

12. A method comprising forming a leadframe having a surrounding frame portion with a number of fingers extending inwardly, proximal portions of the fingers supporting bond pads;

placing distal portions of the fingers below a reference plane defined by a lower surface of the bond pads;

mounting a die on an upper surface of a die pad a lower surface of which lies on the reference plane;

connecting terminals on the die to the upper surfaces of the bond pads;

encapsulating the die, the die pad, the bond pads and the distal portions of the fingers to form a package, taping the distal portions of the fingers to a support surface prior to encapsulating; and removing encapsulating material below the reference plane to expose the lower surface of the bond pads.

13. The method of claim 12, wherein connecting terminals on the die to the upper surfaces of the bond pads comprises wirebonding conductors to the terminals and the bond pads.

14. The method of claim 12, wherein placing distal portions of the fingers below a reference plane comprises forming the leadframe to move the distal portions of the fingers below the reference plane.

15. The method of claim 12, wherein placing distal portions of the fingers below a reference plane comprises etching the distal portions of the fingers to place a top surface of the remaining portions of the fingers below the reference plane.

16. A method comprising forming a leadframe having a surrounding frame portion with a number of fingers extending inwardly, proximal portions of the fingers supporting bond pads;

placing distal portions of the fingers below a reference plane defined by a lower surface of the bond pads;

mounting a die on an upper surface of a die pad a lower surface of which lies on the reference plane;

connecting terminals on the die to the upper surfaces of the bond pads; and encapsulating the die, the die pad, the bond pads and the distal portions of the fingers to form a package, and removing encapsulating material below the reference plane to expose the lower surface of the bond pads.

17. The method of claim 16, wherein removing encapsulating material comprises grinding the package.

18. The method of claim 17, also comprising removing encapsulating material and the distal portion of the fingers.

19. The method of claim 16, wherein removing encapsulating material also comprises singulating the package.

20. A method comprising forming a leadframe having a surrounding frame portion with a number of fingers extending inwardly, proximal portions of the fingers supporting bond pads; placing distal portions of the fingers below a reference plane defined by a lower surface of the bond pads wherein placing the distal portions of the fingers below the reference plane comprises half etching the distal portion of the fingers so that their upper surface lies below the lower surface of the die pad;

mounting a die on an upper surface of a die pad a lower surface of which lies on the reference plane;

connecting terminals on the die to the upper surfaces of the bond pads;

encapsulating the die, the die pad, the bond pads and the distal portions of the fingers to form a package; and removing encapsulating material below the reference plane to expose the lower surface of the bond pads.

21. The method of claim 20, wherein placing the distal portions of the fingers below the reference plane comprises upsetting the bond pads and die pad relative to the fingers and surrounding frame.

22. The method of claim 20, wherein mounting the die on the upper surface of the die pad comprises taping the die to the die pad with double backed tape.

23. The method of claim 20, wherein mounting the die to an upper surface of the die pad comprises securing the die to the die pad using an adhesive material.

24. The method of claim 20, also comprising bonding solder balls to the lower surface of some of the bond pads.

25. The method of claim 24, also comprising further affixing the solder balls to terminals on a motherboard to connect the die to a system.

26. The method of claim 20, wherein a further layer of metal is applied to the die pad prior to mounting the die to it.

* * * * *